(12) United States Patent
Chen et al.

(10) Patent No.: US 12,349,554 B2
(45) Date of Patent: Jul. 1, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Wenbo Chen, Beijing (CN); Bing Zhang, Beijing (CN); Mengyue Fan, Beijing (CN); Chenyu Chen, Beijing (CN); Zhongliu Yang, Beijing (CN); Shuang Zhao, Beijing (CN); Hongting Lu, Beijing (CN); Jing Yang, Beijing (CN); Yanping Ren, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 576 days.

(21) Appl. No.: 17/762,956

(22) PCT Filed: Jun. 3, 2021

(86) PCT No.: PCT/CN2021/098147
§ 371 (c)(1),
(2) Date: Mar. 23, 2022

(87) PCT Pub. No.: WO2021/249277
PCT Pub. Date: Dec. 16, 2021

(65) Prior Publication Data
US 2022/0336571 A1   Oct. 20, 2022

(30) Foreign Application Priority Data
Jun. 11, 2020 (CN) .......................... 202010531318.8

(51) Int. Cl.
*H10K 59/00* (2023.01)
*H10K 50/86* (2023.01)
(Continued)

(52) U.S. Cl.
CPC ......... *H10K 59/123* (2023.02); *H10K 50/865* (2023.02); *H10K 59/1213* (2023.02);
(Continued)

(58) Field of Classification Search
CPC ............ H10K 59/1315; H10K 50/865; H10K 59/1213; H10K 59/122; H10K 59/8052; H10K 59/123
(Continued)

(56) References Cited

U.S. PATENT DOCUMENTS 6,720,577 B2 * 4/2004 Arao ...................... H10D 86/60
257/E27.113
9,356,087 B1 * 5/2016 Lee ........................ H10K 71/00
(Continued)

FOREIGN PATENT DOCUMENTS

| CN | 107886902 A | 4/2018 |
| CN | 107978622 A | 5/2018 |

(Continued)

*Primary Examiner* — Sheikh Maruf
(74) *Attorney, Agent, or Firm* — Nath, Goldberg & Meyer; Joshua B. Goldberg

(57) ABSTRACT

A display substrate has a display region, a peripheral region surrounding the display region, and pad regions on a first connection side of the peripheral region and distal to the display region. The display region includes sub-pixel regions. The display substrate further includes: a base, and organic light-emitting diodes and a first power supply line all on the base. The organic light-emitting diodes are provided in the sub-pixel regions, respectively. A cathode of each organic light-emitting diode extends from the display region to the peripheral region and is connected to the first power
(Continued)

supply line in the peripheral region. The first connection side includes a first connection region corresponding to a position between two adjacent pad regions, and a second connection region other than the first connection region. A connection region between the first power supply line and the cathode covers at least part of the second connection region.

20 Claims, 7 Drawing Sheets

(51) Int. Cl.
  *H10K 59/121* (2023.01)
  *H10K 59/122* (2023.01)
  *H10K 59/123* (2023.01)
  *H10K 59/131* (2023.01)
  *H10K 59/80* (2023.01)
(52) U.S. Cl.
  CPC ....... *H10K 59/122* (2023.02); *H10K 59/1315* (2023.02); *H10K 59/8052* (2023.02)
(58) Field of Classification Search
  USPC .......................................... 257/40
  See application file for complete search history.

(56) References Cited

U.S. PATENT DOCUMENTS

| | | | | |
|---|---|---|---|---|
| 2002/0027247 | A1* | 3/2002 | Arao | H10D 30/031 257/E27.113 |
| 2012/0299878 | A1* | 11/2012 | Takeda | G06V 30/1423 345/107 |
| 2014/0138637 | A1* | 5/2014 | Yang | H10D 86/60 257/40 |
| 2014/0284572 | A1* | 9/2014 | Oooka | H10K 59/123 257/40 |
| 2015/0318339 | A1* | 11/2015 | Nakamura | H10K 50/841 257/98 |
| 2017/0279084 | A1* | 9/2017 | Sakamoto | H10K 59/878 |
| 2017/0337873 | A1* | 11/2017 | Kim | G09G 3/3233 |
| 2018/0108863 | A1* | 4/2018 | Kajiyama | H10K 59/131 |
| 2018/0190944 | A1* | 7/2018 | Lee | H10K 50/816 |
| 2018/0226460 | A1* | 8/2018 | Zhu | H10K 50/81 |
| 2018/0240856 | A1* | 8/2018 | Kim | H10K 59/124 |
| 2018/0358572 | A1* | 12/2018 | Harada | H10K 59/122 |
| 2019/0180683 | A1* | 6/2019 | Lee | G09G 3/3275 |
| 2019/0198799 | A1* | 6/2019 | Lee | H10K 50/84 |
| 2019/0198806 | A1* | 6/2019 | Im | H10K 59/1213 |
| 2020/0135838 | A1* | 4/2020 | Han | H10K 50/824 |
| 2021/0408127 | A1* | 12/2021 | Zhang | H10K 59/123 |

FOREIGN PATENT DOCUMENTS

| | | |
|---|---|---|
| CN | 108493226 A | 9/2018 |
| CN | 111640774 A | 9/2020 |

* cited by examiner

DISPLAY SUBSTRATE AND DISPLAY APPARATUS

This is a National Phase Application filed under 35 U.S.C. 371 as a national stage of PCT/CN2021/098147, filed Jun. 3, 2021, an application claiming the benefit of Chinese Patent Application No. 202010531318.8, filed Jun. 11, 2020, the content of each of which is hereby incorporated by reference in its entirety.

TECHNICAL FIELD

The present disclosure relates to the field of display technology, and specifically relates to a display substrate and a display apparatus.

BACKGROUND

With continuous development of the display technology, large-sized organic light-emitting diode (OLED) display panels are increasingly popular with users. An OLED display panel includes a display device, and a driver chip connected to the display device and configured to drive the display device to implement normal display. In order to reduce a border of the OLED display panel, the driver chip is typically disposed on a back surface of the OLED display panel, and connected to the display device on the OLED display panel through a flexible chip on film (COF). In this case, it is desired that a small IR-drop is present on a lead wire that is in the OLED display panel and connected to a power supply line, so that the OLED display panel has lower power consumption and more uniform display brightness.

SUMMARY

Some embodiments of the present disclosure provide a display substrate and a display apparatus.

In a first aspect, the present disclosure provides a display substrate, having a display region, a peripheral region surrounding the display region, and a plurality of pad regions on a first connection side of the peripheral region and distal to the display region; wherein the display region includes a plurality of sub-pixel regions; and the display substrate further includes: a base, and organic light-emitting diodes and a first power supply line that are on the base; wherein
    the organic light-emitting diodes are provided in the plurality of sub-pixel regions, respectively; and a cathode of each organic light-emitting diode extends from the display region to the peripheral region and is connected to the first power supply line in the peripheral region;
    the first connection side of the peripheral region includes a first connection region corresponding to a position between two adjacent pad regions, and a second connection region other than the first connection region; and
    a connection region between the first power supply line and the cathode covers at least part of the second connection region.

In an embodiment, the second connection region includes a first sub-connection region corresponding to each of the pad regions, and a second sub-connection region other than the first sub-connection region; and the connection region between the first power supply line and the cathode covers the first sub-connection region and the second sub-connection region.

In an embodiment, the display substrate further includes a thin film transistor on the base and disposed in each sub-pixel region; and
    the first power supply line is disposed in the same layer and made of the same material as a source electrode and a drain electrode of the thin film transistor.

In an embodiment, the display substrate further includes a second power supply line in the peripheral region, and a second power supply lead-out wire connected to the second power supply line; wherein
    the second power supply line is located on a side of the first power supply line proximal to the display region; and
    the second power supply line and the second power supply lead-out wire are disposed in the same layer and made of the same material as a gate electrode of the thin film transistor.

In an embodiment, the first power supply line is disconnected at a position near the second power supply lead-out wire; and
    the second power supply lead-out wire is located between two adjacent portions of the disconnected first power supply line.

In an embodiment, one end of each of the two adjacent portions of the first power supply line is connected to a first power supply lead-out wire; and
    the first power supply lead-out wire is disposed in the same layer and made of the same material as the second power supply lead-out wire.

In an embodiment, the display substrate further includes a transfer electrode configured to connect the drain electrode of the thin film transistor to an anode of the organic light-emitting diode; wherein
    the first power supply line includes a first sub-power supply line, a second sub-power supply line, and an insulation layer between the first sub-power supply line and the second sub-power supply line; the first sub-power supply line is connected to the second sub-power supply line through a lap via penetrating through the insulation layer; and
    the first sub-power supply line is disposed in the same layer and made of the same material as both the source electrode and the drain electrode of the thin film transistor; and the second sub-power supply line is disposed in the same layer and made of the same material as the transfer electrode.

In an embodiment, the first sub-power supply line is disconnected at a position near the second power supply lead-out wire; and
    the second power supply lead-out wire is located between two adjacent portions of the disconnected first sub-power supply line.

In an embodiment, the thin film transistor includes only a first gate electrode; and the second power supply line and the second power supply lead-out wire are disposed in the same layer and made of the same material as the first gate electrode of the thin film transistor.

In an embodiment, the thin film transistor includes a first gate electrode and a second gate electrode disposed opposite to each other, and an insulation layer between the first gate electrode and the second gate electrode; and
    the second power supply line and the second power supply lead-out wire are disposed in the same layer and made of the same material as the first or second gate electrode of the thin film transistor.

In an embodiment, a portion of the cathode is directly on the first power supply line, to form a direct connection between the first power supply line and the cathode.

In an embodiment, the display substrate further includes a planarization layer, a pixel defining layer, and a black matrix sequentially disposed between the first power supply line and the cathode, and a lap via penetrating through the planarization layer, the pixel defining layer, and the black matrix, wherein
the first power supply line is connected to the cathode through the lap via.

In an embodiment, the display substrate further includes a passivation layer, a pixel defining layer, and a black matrix sequentially disposed between the first power supply line and the cathode, and a lap via penetrating through the passivation layer, the pixel defining layer, and the black matrix, wherein
the first power supply line is connected to the cathode through the lap via.

In an embodiment, the display substrate further includes a planarization layer between the drain electrode of the thin film transistor and the anode of the organic light-emitting diode, and a first via penetrating through the planarization layer, wherein
the drain electrode of the thin film transistor is connected to the anode of the organic light-emitting diode through the first via.

In an embodiment, the display substrate further includes a passivation layer between the planarization layer and the anode of the organic light-emitting diode, and a third via penetrating through the passivation layer, wherein
the third via and the first via overlap each other and are in communication with each other in a direction perpendicular to the planarization layer or the passivation layer; and
the drain electrode of the thin film transistor is connected to the anode of the organic light-emitting diode through the first via and the third via.

In a second aspect, the present disclosure provides a display apparatus, including the display substrate according to any one of the embodiments in the first aspect of the present disclosure.

In an embodiment, the display apparatus further includes a plurality of first pads and a plurality of second pads disposed in the pad regions; wherein
the plurality of first pads are in one-to-one correspondence with a plurality of first power supply lead-out wires; and
the plurality of second pads are in one-to-one correspondence with a plurality of second power supply lead-out wires.

In an embodiment, the display apparatus further includes a plurality of chip on films, and a plurality of third pads on each of the plurality of chip on films; wherein
one of the first pads and one of the second pads, which are adjacent to each other, are connected to two of the third pads on a same chip on film, respectively.

In an embodiment, the display apparatus further includes a plurality of chip on films, and a plurality of third pads on each of the plurality of chip on films; wherein
two adjacent first pads of the plurality of first pads and one second pad, which is between the two adjacent first pads, of the plurality of second pads are connected to three third pads on a same chip on film, respectively.

DETAIL DESCRIPTION OF EMBODIMENTS

To improve understanding of technical solutions of the present disclosure for those skilled in the art, the present disclosure will be described in detail below with reference to accompanying drawings and specific implementations.

The inventors of the present inventive concept have found that a first power supply line VSS and a second power supply line VDD may be disposed in a display region of an OLED display panel, and the OLED display panel may include a plurality of chip on film COFs near a lower border. Generally speaking, in a portion of the display region of the OLED display panel close to the lower border, only a portion of the first power supply line VSS located between two adjacent chip on films COF is lapped (e.g., overlapped and contacted) with an OLED cathode (i.e., a cathode of an OLED) of the OLED display panel, and the chip on films close to the lower border are connected to the first power supply line VSS through lead-out wires. Therefore, the lapped area between the cathode and the first power supply line VSS is relatively small, and even smaller especially in the case of more chip on films COF. As a result, each wire has increased wiring length and resistance, causing a large and unnecessary IR-drop between the first power supply line VSS and the second power supply line VDD in the OLED display panel, and thereby leading to a relatively high energy consumption of the OLED display panel.

Figure 1:
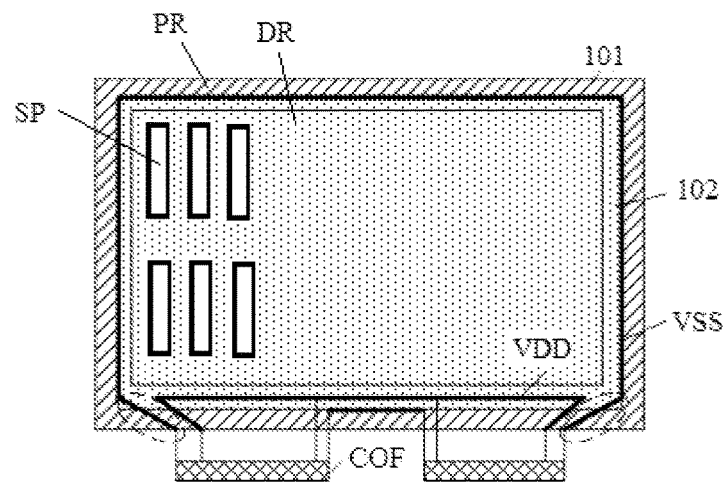
FIG. 1 is a schematic diagram illustrating a planar structure of a display substrate according to an embodiment of the present disclosure.

FIG. 1 is a schematic diagram illustrating a planar structure of a display substrate (e.g., an OLED display substrate) according to an embodiment of the present disclosure. As shown in FIG. 1, the display substrate generally has a display region DR and a peripheral region PR surrounding the display region DR. The display region DR includes a plurality of sub-pixel regions SP. The display substrate may further include: a base 101, an organic light-emitting diode D and a pixel driving circuit (e.g., the thin film transistor 30 in FIGS. 4 and 5) on the base 101, and signal lines, such as a first power supply line VSS and a second power supply line VDD, in the peripheral region PR and configured to provide signals to the pixel driving circuit. An external driver chip is connected to the first power supply line VSS and the second power supply line VDD through external chip on films COF so that a first power supply signal and a second power supply signal can be input to the pixel driving circuit through the first power supply line VSS and the second power supply line VDD, respectively. For example, the first power supply signal input from the first power supply line VSS has a potential lower than a potential of the second power supply signal input from the second power supply line VDD. The pixel driving circuit in the display substrate drives the organic light-emitting diode to emit light according to the received first power supply signal and second power supply signal, thereby implementing a display function of the display substrate.

Figure 2:
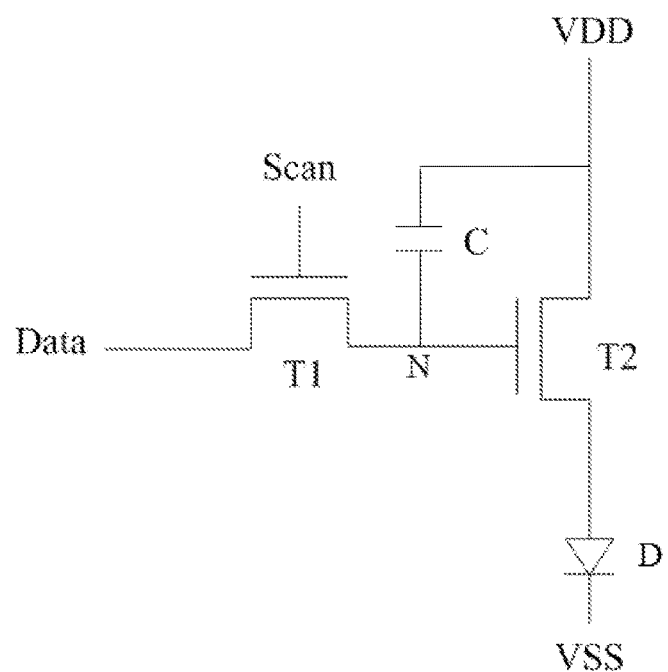
FIG. 2 is a schematic structural diagram of a pixel driving circuit according to an embodiment of the present disclosure.

FIG. 2 is a schematic structural diagram of a pixel driving circuit according to an embodiment of the present disclosure. As shown in FIG. 2, the pixel driving circuit includes: a switch transistor T1, a driving transistor T2, a storage capacitor C and an organic light-emitting diode D. For example, the switch transistor T1 has a gate electrode connected to a gate signal line Scan, a source electrode connected to a data signal line Data, and a drain electrode connected to a first node N. For example, the first node N is a connection point of the drain electrode of the switch transistor T1, a gate electrode of the driving transistor T2, and one terminal of the capacitor C. The driving transistor T2 has the gate electrode connected to the first node N, a source electrode connected to the second power supply line VDD, and a drain electrode connected to an anode of the organic light-emitting diode D. The capacitor C has the one terminal connected to the first node N, and the other terminal connected to the second power supply line VDD. The organic light-emitting diode D has the anode connected to the drain electrode of the driving transistor T2, and a cathode connected to the first power supply line VSS. It should be noted that the first power supply signal input from the first power supply line VSS has a potential lower than a potential of the second power supply signal input from the second power supply line VDD, so that a voltage difference is formed across of the organic light-emitting diode D and turns on the organic light-emitting diode D to emit light.

In the display substrate, the first power supply line VSS may be disposed in the peripheral region PR, a cathode 102 of the organic light-emitting diode D may extend from the display region DR to the peripheral region PR, and the first power supply line VSS may be lapped with the cathode 102 in the peripheral region PR (which will be further described below). However, a side (e.g., the lower side in FIG. 1) of the display substrate is desired to be connected to external chip on films COF, while the chip on films COF are connected to the driver chip on the back side of the display substrate. For the convenience of wiring, in the embodiment shown in FIG. 1, a relatively short segment of the first power supply line VSS is typically disposed merely at a corresponding position between two adjacent external chip on films COF in the peripheral region PR at a side (e.g., the lower side in FIG. 1) proximal to the chip on films COF, and the first power supply line VSS is connected to the chip on films COF through lead-out wires. The first power supply line VSS is not provided at positions directly facing the external chip on films COF, and a portion of the first power supply line VSS (for example, a portion of the first power line VSS close to and bent toward the external chip on films COF, i.e., the portion circled by dotted lines, in FIG. 1) changes a wire direction simply by bending to be connected to the lead-out wires. This portion of the first power supply line VSS is not lapped with the cathode 102 of the organic light-emitting diode D. In this manner, only a small portion of the first power supply line VSS on the side of the peripheral region PR proximal to the chip on films COF is lapped with the cathode 102 of the organic light-emitting diode D. Therefore, the lapped area between the cathode 102 and the first power supply line VSS is relatively small, leading to an increased connection resistance between the cathode 102 and the first power supply line VSS and an increased IR-drop in the display substrate, which tends to cause excessive energy consumption of the display substrate. Especially in the case of a plurality of chip on films COF arranged in a large-sized display substrate, the plurality of chip on films COF further occupy a space reserved for the first power supply line VSS, leading to a further reduced lapped area between the first power supply line VSS and the cathode 102 of the organic light-emitting diode D as well as a further increased IR-drop in the display substrate, and aggravating the problem of excessive energy consumption of the display substrate. For example, for a display substrate having a size of 35.7 mm×27.5 mm, the IR-drop of the first power supply line VSS at a central position thereof is as high as 2 volts (V) or more. Since a large-sized display substrate typically has a higher drive current, according to the logic power consumption P=IU, the IR-drop of 2V will greatly increase energy consumption of the entire display substrate. Other embodiments of the present disclosure provide a display substrate and a display apparatus which aim to solve at least the problem with the small lapped area between the first power supply line VSS and the cathode 102 that tends to cause excessive energy consumption of the display substrate. The display substrate and the display apparatus provided in the embodiments of the present disclosure and having the above advantages will be described in further detail below with reference to specific exemplary implementations and corresponding drawings.

Figure 3:
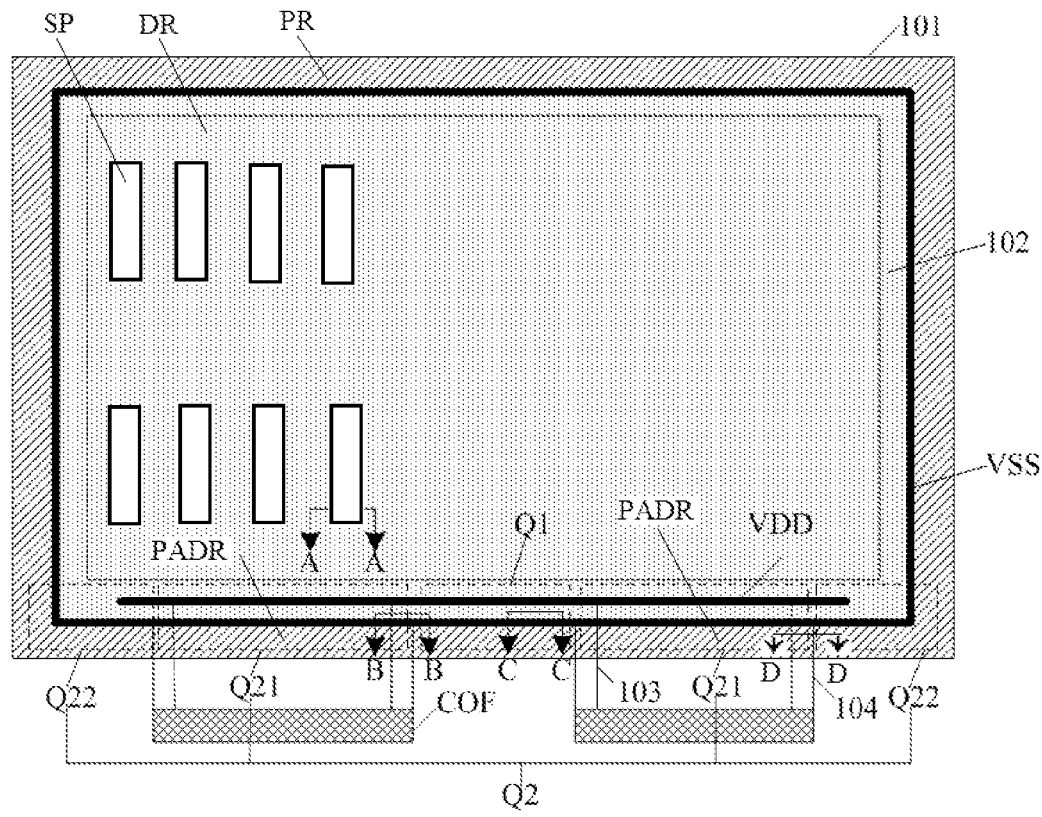
FIG. 3 is a schematic diagram illustrating a planar structure of a display substrate according to an embodiment of the present disclosure.

FIG. 3 is a schematic diagram illustrating a planar structure of a display substrate according to an embodiment of the present disclosure. As shown in FIG. 3, the display substrate also has a display region DR and a peripheral region PR surrounding the display region DR, as well as a plurality of pad regions PADR provided on a first side of the peripheral region and distal to the display region DR. The display region DR includes a plurality of sub-pixel regions SP. The display substrate may further include: a base 101, and an organic light-emitting diode D (shown in FIGS. 4 and 5) and a first power supply line VSS on the base 101. Each sub-pixel region SP is provided with an organic light-emitting diode D. A cathode 102 of the organic light-emitting diode D extends from the display region DR to the peripheral region PR, and is connected to the first power supply line VSS in the peripheral region PR. A first connection side (e.g., the lower side in FIG. 3) of the peripheral region PR includes a first connection region Q1 corresponding to a position between two adjacent pad regions PADR, and a second connection region Q2 other than the first connection region Q1. A connection region between the first power supply line VSS and the cathode 102 covers at least part of the second connection region Q2.

In the display substrate provided in the embodiments of the present disclosure, cathodes 102 of all OLEDs in the display region DR form a one-piece structure, or cathodes 102 of multiple rows/columns of OLEDs form a one-piece structure. In the embodiments of the present disclosure, the case where cathodes 102 of all OLEDs form a one-piece structure is taken as an example for description. The cathodes of all OLEDs may form a unitary cathode 102 that extends from the display region DR to the peripheral region PR and that is connected to the first power supply line VSS in the peripheral region PR. The peripheral region PR of the display substrate surrounding the display region DR may have four connection sides, i.e., a first connection side (e.g., the lower side in FIG. 3) where external chip on films COF are to be connected, and rest three connection sides other than the first connection side. A connection region between the first power supply line VSS and the cathode 102 may completely cover the rest three connection sides. A plurality of pad regions PADR are provided on the first connection side and distal to the display region DR, and each pad region PADR may be provided with a pad to be connected to an external chip on film COF. As described above, the first connection side of the peripheral region PR may include a first connection region Q1 corresponding to a position between two adjacent pad regions PADR, and a second connection region Q2 other than the first connection region Q1. In the first connection region Q1, the first power supply line VSS is connected to the cathode 102. In the second connection region Q2, the connection region between the first power supply line VSS and the cathode 102 covers at least the second connection region Q2. In this manner, the first power supply line VSS may be sufficiently lapped with the unitary cathode 102 of the OLED in any connection side of the peripheral region PR. As can be seen from the foregoing description that, compared to the display substrate in the embodiment shown in FIG. 1, in the display substrate of this embodiment, the first power supply line VSS is lapped with the cathode 102 in the rest three connection sides of the peripheral region PR other than the first connection side as well as the first connection region Q1 and the second connection region Q2 of the first connection side. Therefore, the lapped area between the first power supply line VSS and the cathode 102 is notably increased, which can reduce the connection resistance between the first power supply line VSS and the cathode 102 and thus the IR-drop, thereby further reducing the energy consumption of the display substrate.

In some embodiments, as shown in FIG. 3, the second connection region Q2 includes a first sub-connection region Q21 corresponding to each of the pad regions PADR, and a second sub-connection region Q22 other than the first sub-connection region Q21; and the connection region between the first power supply line VSS and the cathode 102 covers the first sub-connection region Q21 and the second sub-connection region Q22.

It should be noted that the second connection region Q2 includes the first sub-connection region Q21 corresponding to each of the pad regions PADR, and second sub-connection regions Q22 other than first sub-connection regions Q21. For example, each first sub-connection region Q21 is the same as the region in the peripheral region PR directly facing each external chip on film COF in the embodiment shown in FIG. 1, and each second sub-connection region Q22 is the same as the portion circled by the dotted line in FIG. 1. In the embodiment shown in FIG. 1, the first power supply line VSS is not provided or only a small fraction of the first power supply line VSS is provided in the first and second sub-connection regions Q21 and Q22, and the first power supply line VSS is not lapped with the cathode 102. In this embodiment, the connection region between the first power supply line VSS and the cathode 102 covers the first sub-connection regions Q21 and the second sub-connection regions Q22. It can be seen that, compared with the display substrate in the embodiment shown in FIG. 1, in the display substrate of this embodiment, the lapped area between the first power supply line VSS and the cathode 102 is notably increased at the first connection side of the peripheral region PR, which can reduce the connection resistance between the first power supply line VSS and the cathode 102 and thus the IR-drop, thereby further reducing the energy consumption of the display substrate.

Figure 4:
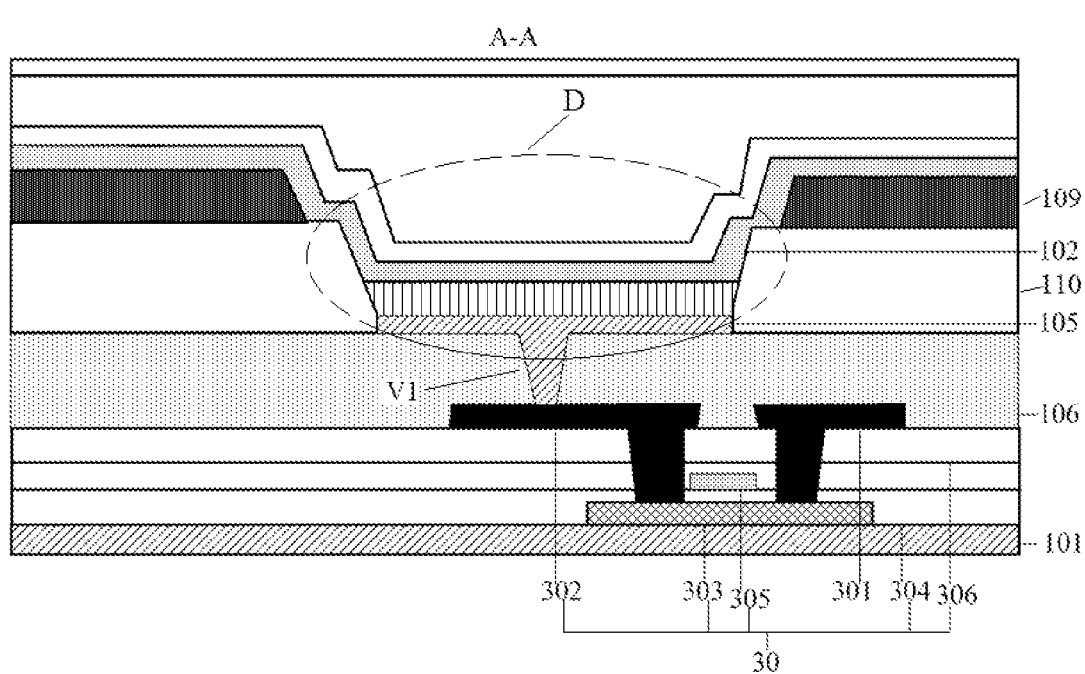
FIG. 4 is a schematic sectional view of the display substrate shown in FIG. 3 taken along line A-A according to an embodiment of the present disclosure.
Figure 12:
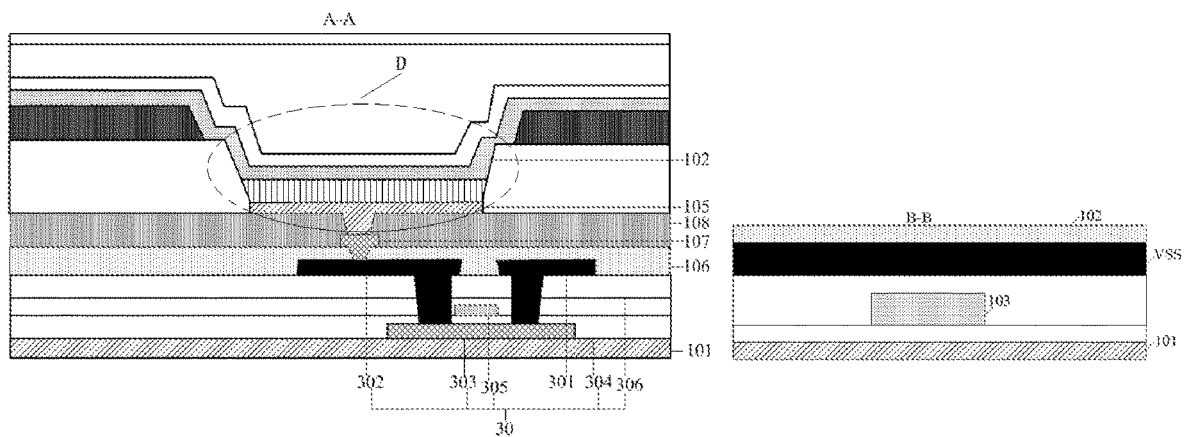
FIG. 12 is a schematic diagram of the display substrate of FIG. 3 or FIG. 11 in which a second power supply lead-out wire is disposed in the same layer as a gate electrode, and a first power supply line is disposed in the same layer as both a source electrode and a drain electrode.

In some embodiments, FIG. 4 is a schematic sectional view of the display substrate shown in FIG. 3 taken along line A-A, which illustrates a structure of one of the plurality of sub-pixels in the display substrate. As shown in FIG. 4, the display substrate further includes a thin film transistor 30 on the base 101; and each sub-pixel region SP is provided with the thin film transistor 30. The first power supply line VSS is disposed in the same layer and made of the same material as a source electrode 301 and a drain electrode 302 of the thin film transistor 30, as shown in FIG. 12.

It should be noted that the thin film transistor 30 in the display substrate shown in FIG. 4 may be any transistor in the pixel driving circuit, and in this embodiment, the case where the thin film transistor 30 is the driving transistor T2 in the pixel driving circuit shown in FIG. 2 is taken as an example for illustration. It will be appreciated that the switch transistor T1 may be made to have the same structure and in the same method as the thin film transistor 30, which will not be described in detail herein. Each sub-pixel region SP may be provided with a thin film transistor 30 to drive the organic light-emitting diode D in the sub-pixel region SP to emit light, thereby implementing a display function. As shown in FIG. 4, the thin film transistor 30 includes an active layer 303, a gate insulation layer 304, a gate electrode 305, an interlayer insulation layer 306, a source electrode 301, and a drain electrode 302 sequentially disposed on the base 101. For example, the source electrode 301 and the drain electrode 302 are disposed in a same layer, and connected to two ends of the active layer 303 through vias penetrating through the interlayer insulation layer 306 and the gate insulation layer 304, respectively. A planarization layer 106 is further provided on a film layer where the source electrode 301 and the drain electrode 302 are located, and an OLED device (i.e., the organic light-emitting diode D) is disposed on the planarization layer 106. The planarization layer 106 may planarize the source electrode 301 and the drain electrode 302 to be attached to other film layers. The drain electrode 302 may be connected to an anode 105 of the OLED through a via (which may be referred to as a first via) V1 penetrating through the planarization layer 106 to provide a power supply signal to the OLED, and the specific structure of the OLED device will be described in further detail in later embodiments. It will be appreciated that besides the film layers described above, the display substrate according to the embodiments of the present disclosure may further include other conventional film layers such as a barrier layer, a buffer layer, and/or an encapsulation layer, which have the same structure and are made in the same process as those in the existing art, and thus are not repeated here. In practical applications, the first power supply line VSS may be made of a single metal layer, and may be disposed in the same layer as the source electrode 301 and the drain electrode 302 of the thin film transistor 30. In this manner, the first power supply line VSS, the source electrode 301 and the drain electrode 302 may be formed in a same process with a same material, thereby simplifying a manufacturing process of the display substrate, as shown in FIG. 12. For example, the first power supply line VSS, the source electrode 301 and the drain electrode 302 may each be formed in an evaporation process with copper or other metals. It will be appreciated that, in an embodiment the present disclosure, two or more functional layers disposed in a same layer means that the functional layers disposed in the same layer may be formed in a same process (e.g., patterning, etc.) with a same material, thereby simplifying the manufacturing process of the display substrate.

Figure 13:
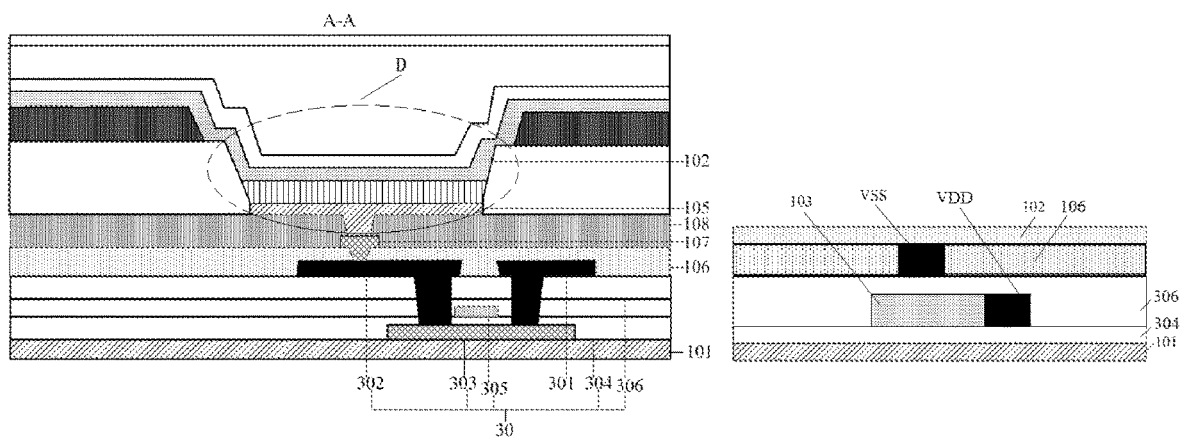
FIG. 13 is a schematic diagram of the display substrate of FIG. 3 or FIG. 11 in which a second power supply line and a second power supply lead-out wire are disposed in the same layer as a gate electrode.

In some embodiments, as shown in FIGS. 3, 4 and 13, the display substrate further includes a second power supply line VDD in the peripheral region PR, and a second power supply lead-out wire 103 connected to the second power supply line VDD. The second power supply line VDD is located on a side of the first power supply line VSS proximal to the display region DR. The second power supply line VDD and the second power supply lead-out wire 103 are disposed in the same layer and made of the same material as the gate electrode 305 of the thin film transistor 30, as shown in FIG. 13. It will be appreciated that the right portion of FIG. 13 may be a sectional view of the display substrate shown in FIG. 3 taken along any second power supply lead-out wire 103.

Figure 6:
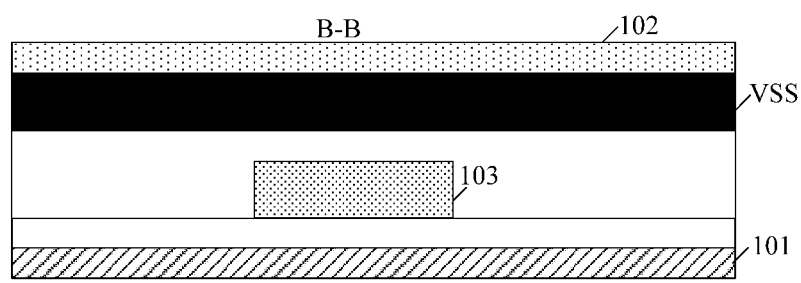
FIG. 6 is a schematic sectional view of the display substrate shown in FIG. 3 taken along line B-B according to an embodiment of the present disclosure.
Figure 9:
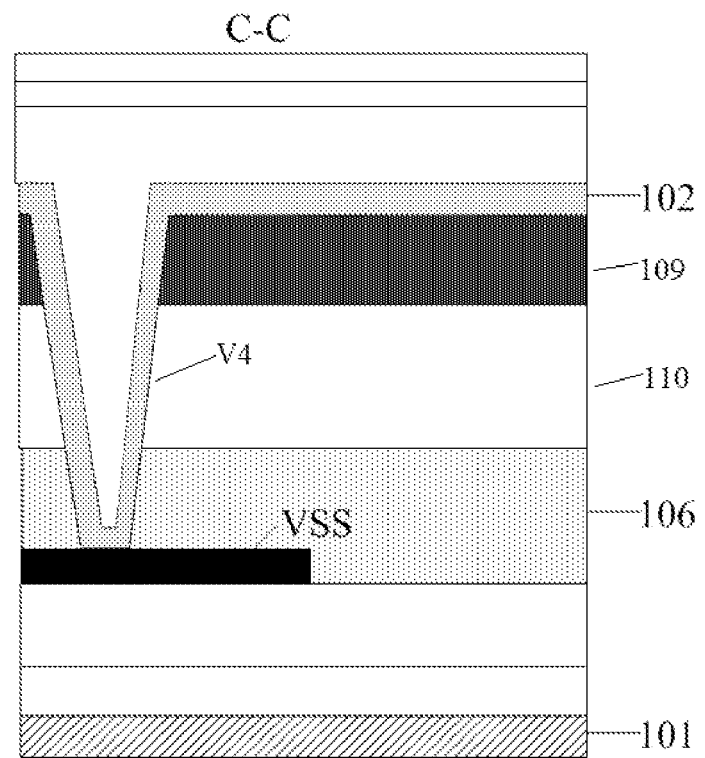
FIG. 9 is a schematic sectional view of the display substrate shown in FIG. 3 taken along line C-C according to an embodiment of the present disclosure.

It should be noted that the second power supply line VDD in the peripheral region PR may be arranged to have a lateral strip shape, or have an annular shape surrounding the display region DR. In the embodiments of the present disclosure, the case where the second power supply line VDD has a lateral strip shape (as shown in FIG. 3) is taken as an example for illustration. The second power supply line VDD is closer to the display region DR than the first power supply line VSS. The second power supply line VDD may be connected to an external chip on film COF through the second power supply lead-out wire 103. In practical applications, the second power supply line VDD and the second power supply lead-out wire 103 may be disposed in the same layer (as shown in FIG. 13), and made of the same material in the same process, as the gate electrode 305 of the thin film transistor 30, thereby simplifying the manufacturing process of the display substrate. For example, the second power supply line VDD, the second power supply lead-out wire 103, and the gate electrode 305 of the thin film transistor 30 may be formed by deposition, photoresist coating, exposure, development and/or etching with aluminum or other metals. It should be noted here that since the second power supply line VDD is closer to the display region DR than the first power supply line VSS, the second power supply line VDD, when being connected to the external chip on film COF through the second power supply lead-out wire 103, passes through a region where the first power supply line VSS is located. In this embodiment, the first power supply line VSS is made of a single metal layer (as shown in FIGS. 6 and 9), the second power supply line VDD and the second power supply lead-out wire 103 are disposed in the same layer as the gate electrode 305 of the thin film transistor 30 (as shown in FIG. 13), and the first power supply line VSS is disposed in the same layer as the source electrode 301 and the drain electrode 302 of the thin film transistor 30 (as shown in FIGS. 12 and 13). As shown in FIGS. 3, 6 and 13, the second power supply lead-out wire 103 may pass through a film layer (e.g., the interlayer insulation layer 306, as shown in FIG. 13) under the first power supply line VSS to be connected to an external chip on film COF. In this manner, the second power supply lead-out wire 103 passing through under the first power supply line VSS may prevent an influence of the second power supply lead-out wire 103 on the lapped area between the first power supply line VSS and the cathode 102. Therefore, the lapped area between the first power supply line VSS and the cathode 102 is increased, the connection resistance and thus the IR-drop are reduced, and the energy consumption is reduced.

Figure 7:
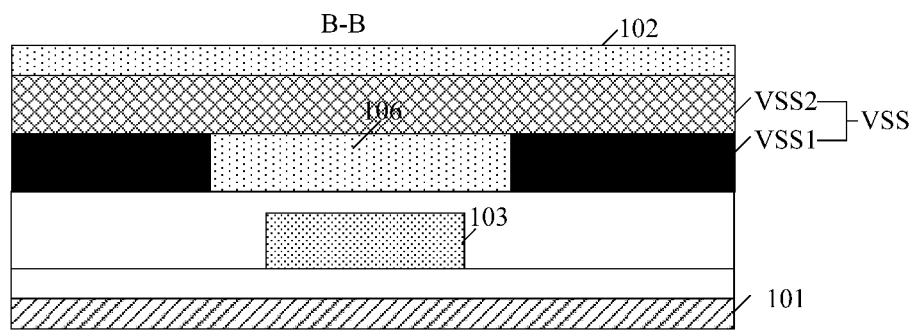
FIG. 7 is another schematic sectional view of the display substrate shown in FIG. 3 taken along line B-B according to an embodiment of the present disclosure.

In some embodiments, as shown in FIGS. 4, 7 (which shows the first power supply line VSS partially disconnected), 8 (which shows the first power supply line VSS completely disconnected) and 11, a portion of the first power supply line VSS close to the second power supply lead-out wire 103 is disconnected; and the second power supply lead-out wire 103 is located between two adjacent portions of the disconnected first power supply line VSS.

Figure 8:
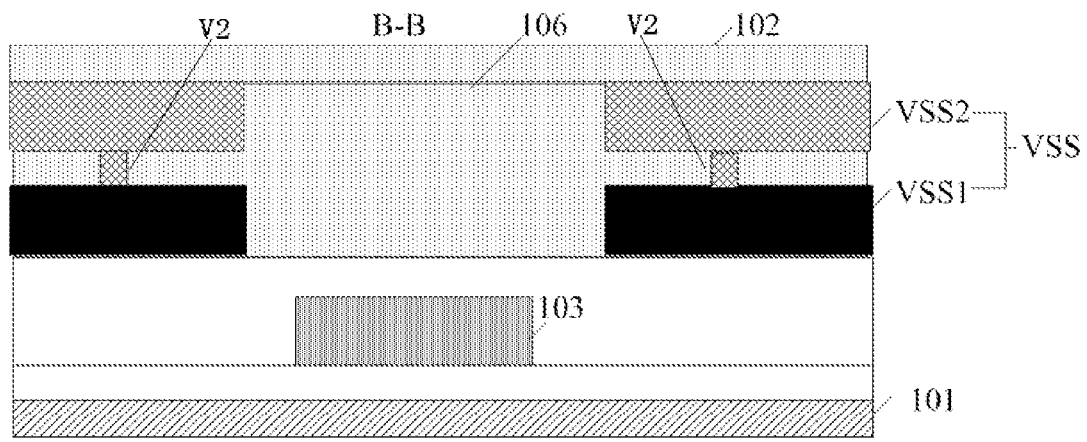
FIG. 8 is yet another schematic sectional view of the display substrate shown in FIG. 3 taken along line B-B according to an embodiment of the present disclosure.
Figure 11:
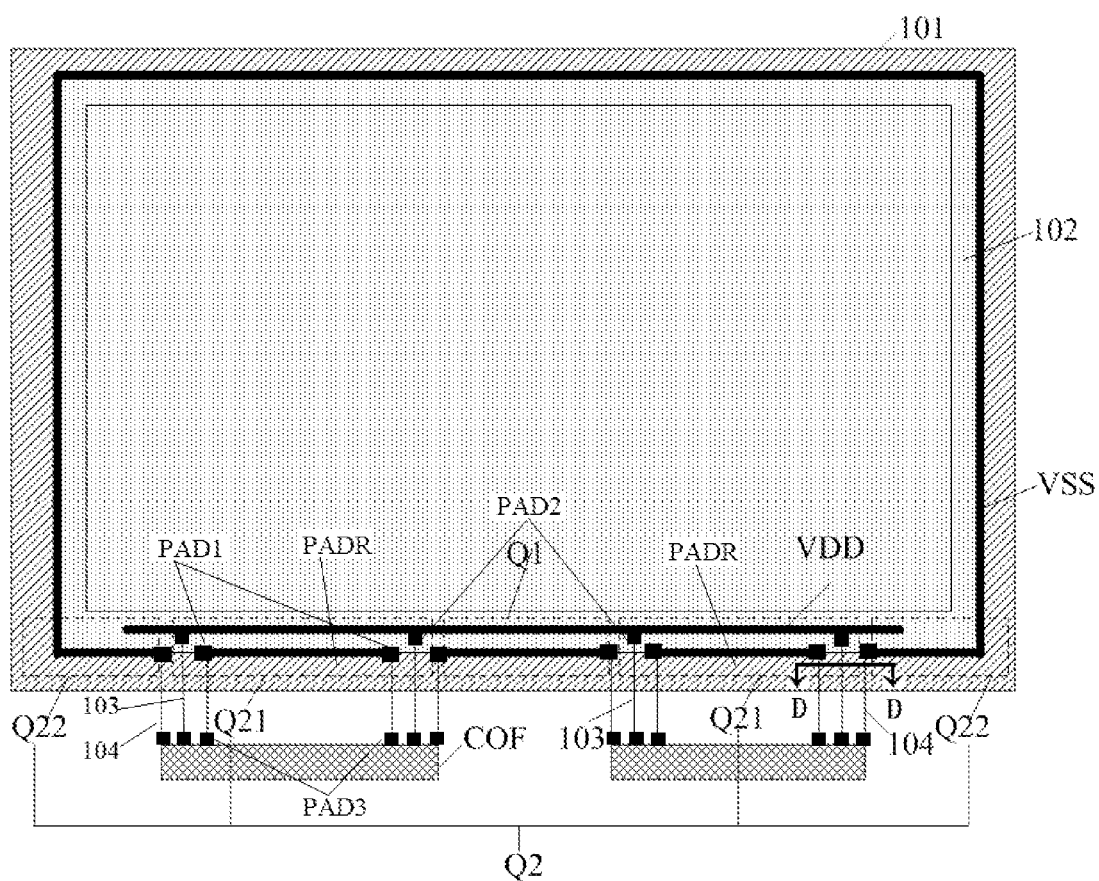
FIG. 11 is a schematic diagram illustrating a planar structure of another display substrate according to an embodiment of the present disclosure.

It should be noted that since the second power supply line VDD is closer to the display region DR than the first power supply line VSS, the second power supply line VDD, when being connected to the external chip on film COF through the second power supply lead-out wire 103, passes through a region where the first power supply line VSS is located. At this time, as shown in FIGS. 7 and 8, the first power supply line VSS may be partially or completely disconnected at a position corresponding to the second power supply lead-out wire 103. In this manner, the disconnected first power supply line VSS may reserve a wiring space for the second power supply lead-out wire 103, and the second power supply lead-out wire 103 may pass through the disconnected position of, or a corresponding position below, the first power supply line VSS to be connected to the external chip on film COF. In this manner, the disconnected first power supply line VSS allows the second power supply lead-out wire 103 to be connected to one end of the external chip on film COF from the disconnected position, while two first power supply lead-out wires 104 are led out at both sides of the second power supply lead-out wire 103 (as shown in FIG. 11). The other end of the COF is arranged in a same manner, and the first power supply lead-out wires 104 at two ends of the chip on film COF may form a bridge connection to prevent an influence of the second power supply lead-out wire 103 on the lapped area between the first power supply line VSS and the cathode 102. Therefore, the lapped area between the first power supply line VSS and the cathode 102 is increased, the connection resistance and thus the IR-drop are reduced, and the energy consumption is reduced. Meanwhile, since a portion of the first power supply line VSS corresponding to the second power supply lead-out wire 103 is disconnected, the second power supply line VDD, and the second power supply lead-out wire 103 may not directly face the first power supply line VSS in a direction perpendicular to the first connection side (e.g., the vertical direction in FIG. 11), thereby preventing the problem of heat generation caused due to different power supply lines directly facing each other, and thus reducing the energy consumption. It will be appreciated that at this time, the first power supply line VSS may be made of a single metal layer, or may be made of dual metal layers.

Figure 14:
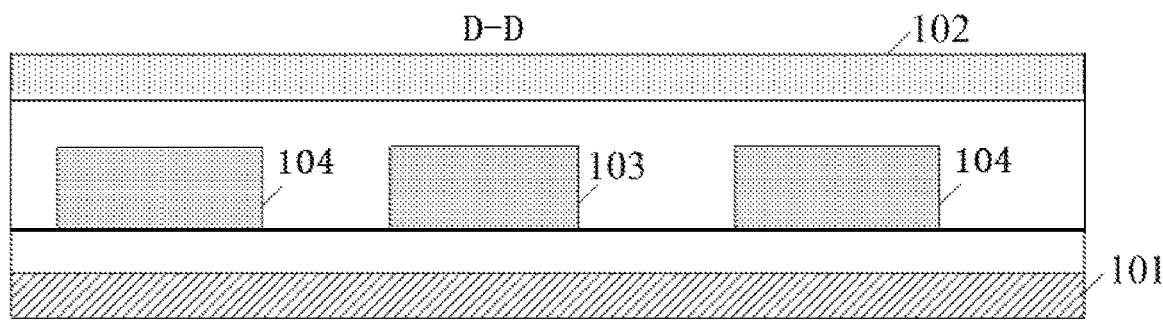
FIG. 14 is a schematic sectional view of the display substrate shown in FIG. 11 taken along line D-D, which shows an example in which a first power supply lead-out wire is disposed in the same layer as a second power supply lead-out wire.

In some embodiments, each disconnected end of the first power supply line VSS (i.e., the end proximal to each second power supply lead-out wire 103) is connected to a first power supply lead-out wire 104; and each first power supply lead-out wire 104 is disposed in the same layer and made of the same material as each second power supply lead-out wire 103 (as shown in FIG. 14).

It should be noted that when the first power supply line VSS is disconnected, a wiring space is reserved for a second power supply lead-out wire 103, and at this time, each first power supply lead-out wire 104 and each second power supply lead-out wire 103 may be disposed in a same layer, and formed in a same process with a same material, thereby simplifying the manufacturing process of the display substrate.

Figure 5:
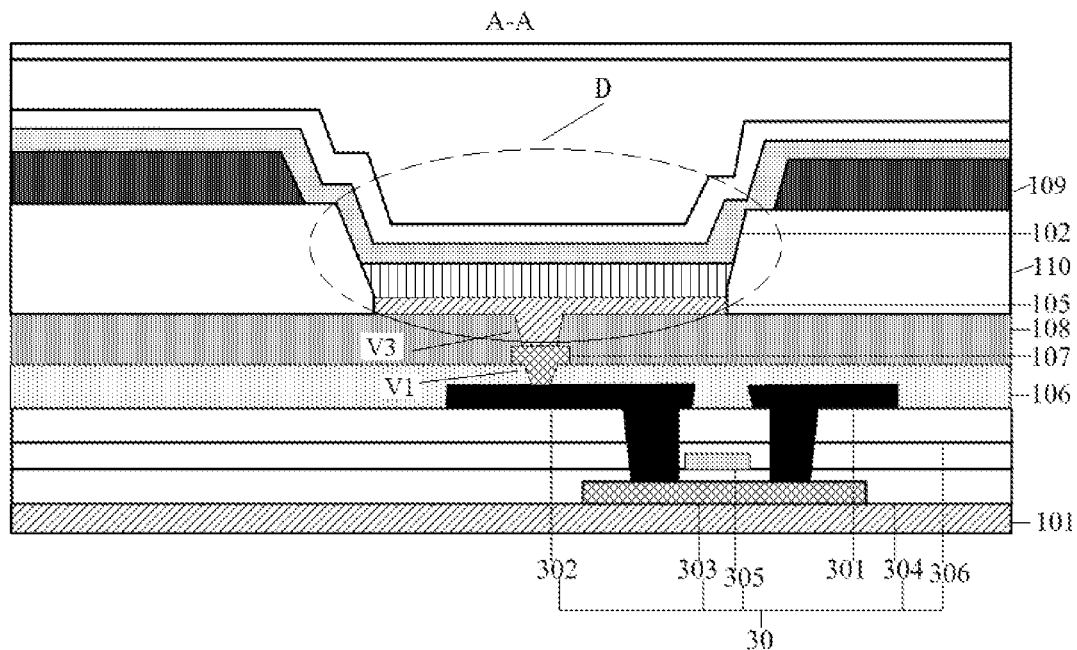
FIG. 5 is another schematic sectional view of the display substrate shown in FIG. 3 taken along line A-A according to an embodiment of the present disclosure.
Figure 15:
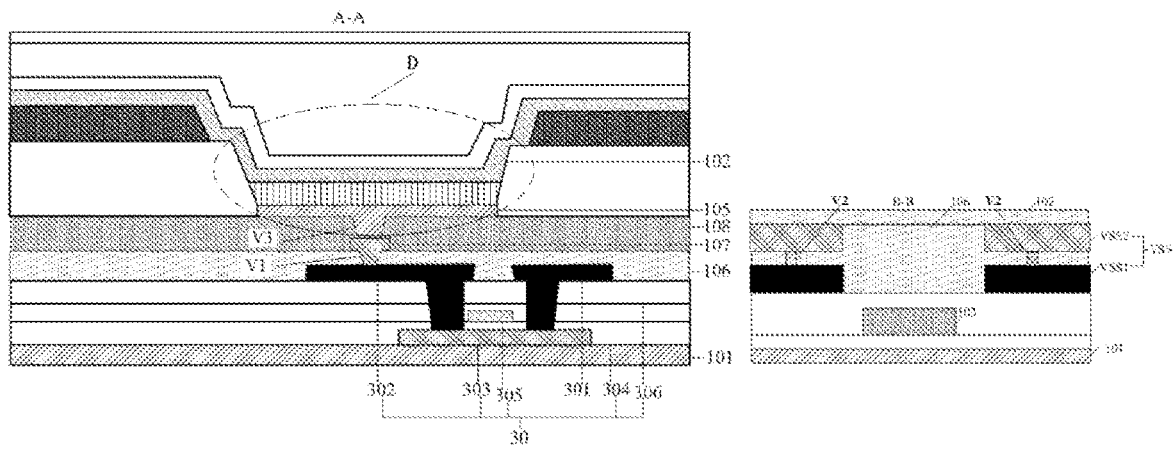
FIG. 15 is a schematic diagram of the display substrate of FIG. 11 in which a first sub-power supply line is disposed in the same layer as both a source electrode and a drain electrode of a thin film transistor, and a second sub-power supply line is disposed in the same layer as a transfer electrode.

In some embodiments, as shown in FIGS. 3, 5 and 8, in order to protect metal layers in the device from invasion of external moisture or the like and prevent oxidation reactions, in practical applications, a passivation layer 108 is typically disposed on the planarization layer 106, and the anode 105 of the organic light-emitting diode D is connected to the drain electrode 302 of the thin film transistor 30 through a transfer electrode 107 in the first via V1. At this time, the first power supply line VSS may include a two-layer structure. That is, the first power supply line VSS includes a first sub-power supply line VSS1, a second sub-power supply line VSS2, and an insulation layer (e.g., the planarization layer 106) between the first sub-power supply line VSS1 and the second sub-power supply line VSS2, as shown in FIG. 8. The first sub-power supply line VSS1 and the second sub-power supply line VSS2 are connected to each other through a lap via (which may be referred to as a second via) V2 penetrating through the insulation layer. The first sub-power supply line VSS1 is disposed in the same layer and made of the same material as both the source electrode 301 and the drain electrode 302 of the thin film transistor 30, and the second sub-power supply line VSS2 is disposed in the same layer and made of the same material as the transfer electrode 107, as shown in FIG. 15.

It should be noted that the organic light-emitting diode may include an anode 105 disposed opposite to the cathode 102, and an organic functional layer located between the cathode 102 and the anode 105. The organic functional layer may include conventional layers such as a hole injection layer, a hole transport layer, an organic light emitting layer, an electron transport layer, an electron injection layer, and the like sequentially disposed in a direction from the anode 105 to the cathode 102. A planarization layer 106 is disposed on the source electrode 301 and the drain electrode 302 of the thin film transistor 30 to planarize the source electrode 301 and the drain electrode 302 to facilitate attachment to other film layers. A passivation layer 108 is disposed on the planarization layer 106 to protect metal layers in the device from invasion of external moisture or the like and prevent oxidation reactions. The transfer electrode 107, which is made of a conductive material and located in the via V1, may be connected to the drain electrode 302 through the via V1 penetrating through the planarization layer 106 and a via (which may be referred to as a third via) V3 penetrating through the passivation layer 108. As shown in FIG. 5, the via V3 and the via V1 overlap each other and are in communication with each other in a direction (i.e., the vertical direction in FIG. 5) perpendicular to the planarization layer 106 or the passivation layer 108. The anode 105 of the organic light-emitting diode D may be connected to the transfer electrode 107 through the via penetrating through the passivation layer 108 so that a second power supply signal supplied from the second power supply line VDD is input to the anode 105 of the organic light-emitting diode D through the thin film transistor 30. The organic functional layer may emit light when driven by a first power supply signal from the first power supply line VSS and a second power supply signal from the second power supply line VDD, so as to implement display. In practical applications, the first power supply line VSS may be made of dual metal layers. That is, the first power supply line VSS includes a first sub-power supply line VSS1, a second sub-power supply line VSS2, and an insulation layer (e.g., the planarization layer 106) between the first sub-power supply line VSS1 and the second sub-power supply line VSS2. The first sub-power supply line VSS1 and the second sub-power supply line VSS2 are connected to each other through a lap via V2 penetrating through the insulation layer, as shown in FIG. 8. It will be appreciated that by adopting the dual metal layer structure, a resistance of the formed first power supply line VSS can be reduced, thereby reducing the IR-drop. The first sub-power supply line VSS1 is disposed in the same layer and made of the same material in the same process as both the source electrode 301 and the drain electrode 302 of the thin film transistor 30, thereby simplifying the manufacturing process of the display substrate, as shown in FIG. 15. Likewise, the second sub-power supply line VSS may be disposed in the same layer and made of the same material in the same process as the transfer electrode 107, thereby simplifying the manufacturing process of the display substrate, as shown in FIG. 15. It will be appreciated that the insulation layer between the first sub-power supply line VSS1 and the second sub-power supply line VSS2 may form a one-piece structure with the planarization layer 106.

Figure 10:
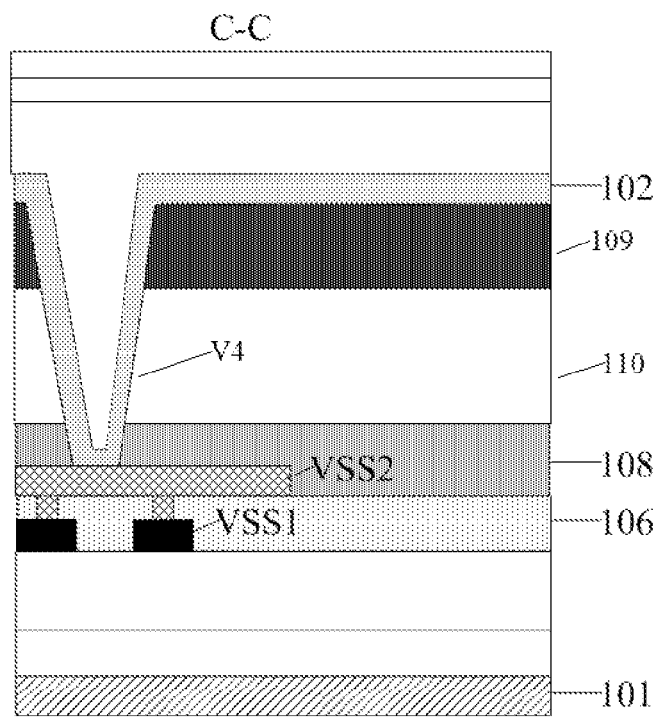
FIG. 10 is another schematic sectional view of the display substrate shown in FIG. 3 taken along line C-C according to an embodiment of the present disclosure.

It should be noted here that the first power supply line VSS and the cathode 102 of the OLED are located in different film layers (as shown in FIGS. 6 to 10), and as shown in FIGS. 6, 7 and 8, during the manufacturing process, a part of the cathode 102 may be directly formed on the film layer where the first power supply line VSS is located, thereby implementing direct connection between the first power supply line VSS and the cathode 102 of the OLED. Alternatively, a via (which may also be referred to as a fourth via) V4 may be provided in another film layer between the first power supply line VSS and the cathode 102 (as shown in FIGS. 9 and 10), through which the first power supply line VSS is connected to the cathode 102, thereby implementing connection between the first power supply line VSS and the cathode 102 of the OLED. Illustratively, in an embodiment of the present disclosure, the method shown in FIGS. 6, 7 and 8 is adopted to form a part of the cathode 102 directly on the film layer where the first power supply line VSS is located, which can reduce manufacturing steps and resistance of the cathode 102. As shown in FIG. 9, in the case where the first power supply line VSS includes a single metal layer, the via V4 may penetrate through a planarization layer 106, a pixel defining layer 110, and a black matrix 109 sequentially disposed between the first power supply line VSS and the cathode 102, so that the first power supply line VSS and the cathode 102 are electrically connected to each other through a metal material of the cathode 102 filled in the via V4. As shown in FIG. 10, in the case where the first power supply line VSS includes dual metal layers (i.e., the first sub-power supply line VSS1 and the second sub-power supply line VSS2), the via V4 may penetrate through a passivation layer 108, a pixel defining layer 110, and a black matrix 109 sequentially disposed between the first power supply line VSS (e.g., the second sub-power supply line VSS2 of the first power supply line VSS) and the cathode 102, so that the first power supply line VSS (e.g., the second sub-power supply line VSS2 of the first power supply line VSS) and the cathode 102 are electrically connected to each other through a metal material of the cathode 102 filled in the via V4.

In some embodiments, as shown in FIGS. 5, 7, 8 and 10, a portion of the first sub-power supply line VSS1 close to the second power supply lead-out wire 103 is disconnected; and the second power supply lead-out wire 103 is located between disconnected portions of the first sub-power supply line VSS1.

It should be noted that, in practical applications, when the first power supply line VSS is made of dual metal layers, the dual metal layers are respectively made into a first sub-power supply line VSS1 and a second sub-power supply line VSS2, and a portion of the first sub-power supply line VSS1 corresponding to a position of the second power supply lead-out wire 103 may be disconnected. In this manner, a wiring space can be reserved for the second power supply lead-out wire 103 in the film layer where the first sub-power supply line VSS1 is located, and the second power supply lead-out wire 103 can pass through the disconnected first sub-power supply line VSS1. As a result, an influence of the second power supply lead-out wire 103 on the lapped area between the first power supply line VSS and the cathode 102 can be prevented, and the lapped area between the first power supply line VSS and the cathode 102 is increased, while the connection resistance and thus the IR-drop are reduced, and the energy consumption is reduced.

In some embodiments, thin film transistor 30 includes only a first gate electrode (e.g., the gate electrode 305 as shown in FIGS. 4 and 5). In this case, the second power supply line VDD and the second power supply lead-out wire 103 are disposed in the same layer and made of the same material as the first gate electrode of the thin film transistor 30, as shown in FIG. 13.

It should be noted that the thin film transistor 30 in the display substrate provided in the embodiments of the present disclosure may have a single-gate electrode structure, and include only the first gate electrode (e.g., the gate electrode 305 as shown in FIGS. 4 and 5). As shown in FIG. 13, the second power supply line VDD and the second power supply lead-out wire 103 may be disposed in the same layer, and made of the same material in the same process, as the first gate electrode of the thin film transistor 30, thereby simplifying the manufacturing process of the display substrate.

Figure 16:
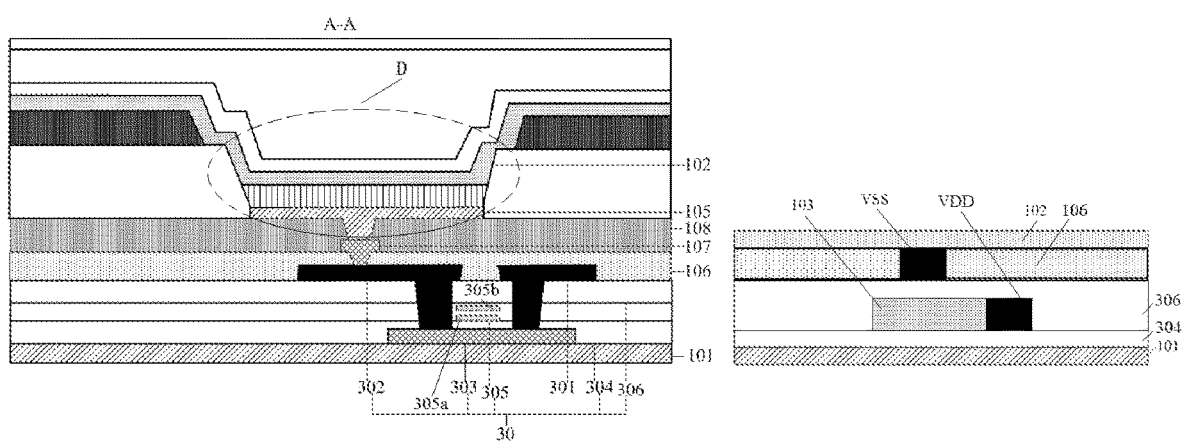
FIG. 16 is a schematic diagram of the display substrate of FIG. 3 or FIG. 11 in which a thin film transistor includes a first gate electrode and a second gate electrode disposed opposite to each other, and an insulation layer between the first gate electrode and the second gate electrode, and a second power supply line and a second power supply lead-out wire are disposed in the same layer as the first or second gate electrode of the thin film transistor.

In some embodiments, the thin film transistor 30 includes a first gate electrode 305a and a second gate electrode 305b disposed opposite to each other, and an insulation layer between the first gate electrode 305a and the second gate electrode 305b (for example, the insulation layer may be a part of the interlayer insulation layer 306); and the second power supply line VDD and the second power supply lead-out wire 103 are disposed in the same layer and made of the same material as the first gate electrode 305a or the second gate electrode 305b of the thin film transistor 30, as shown in FIG. 16.

It should be noted that the thin film transistor 30 in the display substrate provided in the embodiments of the present disclosure may have a dual-gate electrode structure, and includes the first gate electrode 305a and the second gate electrode 305b insulated from each other. The second power supply line VDD and the second power supply lead-out wire 103 may be disposed in the same layer, and made of the same material in the same process, as the first gate electrode 305a or the second gate electrode 305b of the thin film transistor 30, thereby simplifying the manufacturing process of the display substrate, as shown in FIG. 16.

Based on the same inventive concept, an embodiment of the present disclosure provides a display apparatus, including the display substrate according to any one of the embodiments shown in FIGS. 1 to 16. The display apparatus may be a display apparatus having a large-sized display substrate, such as a smart television or the like.

In some embodiments, the display device further includes a plurality of first pads PAD1 and a plurality of second pads PAD2 in the pad region PADR; the plurality of first pads PAD1 are in one-to-one correspondence with a plurality of first power supply lead-out wires 104; and the plurality of second pads PAD2 are in one-to-one correspondence with a plurality of second power supply lead-out wires 103, as shown in FIG. 11.

It should be noted that each of the first pads PAD1 may be disposed at an end of a corresponding first power supply lead-out wire 104 (e.g., the end connected to a corresponding first power supply line VSS), and each of the second pads PAD2 may be disposed at an end of a corresponding second power supply lead-out wire 103 (e.g., the end connected to a corresponding second power supply line VDD), so as to be bound to external chip on films COF through the first pads PAD1 and the second pads PAD2, as shown in FIG. 11.

In some embodiments, the display apparatus further includes a plurality of chip on films COF, as shown in FIGS. 3 and 11. Each chip on film COF may include a flexible substrate and a driver or a driver integrated circuit (driver IC) on the flexible substrate. Each chip on film COF is provided with a plurality of third pads PAD3, as shown in FIG. 11. In addition, a first pad PAD1 and an adjacent second pad PAD2 are connected to two third pads PAD3 on a same chip on film COF, respectively (which is applicable to the display substrate shown in FIG. 3). Alternatively, two adjacent first pads PAD1 and a second pad PAD2 between the two adjacent first pads PAD1 are connected to three adjacent third pads PAD3 on a same chip on film COF, respectively, as shown in FIG. 11.

It should be noted that, in practical applications, a display apparatus having a large-sized display substrate generally needs a plurality of driver chips to provide signals due to high power. Thus, a plurality of chip on films COF are desired to bind and connect signal lines in the display substrate to the plurality of driver chips. In the case where the first power supply line VSS is continuous (as in the embodiment shown in FIG. 3), the second power supply lead-out wires 103 may pass through a film layer under the first power supply line VSS, and only one first power supply lead-out wire 104 is desired to implement connection to an end of each external chip on film COF. In this manner, two adjacent third pads PAD3 are desired to be bound to merely one first pad PAD1 and one second pad PAD2 that are adjacent to each other. In the case where the first power supply line VSS is disconnected (as in the embodiment shown in FIG. 11), each second power supply lead-out wire 103 may pass through a corresponding film layer between two adjacent portions of the disconnected first power supply line VSS, while the two adjacent portions of the disconnected first power supply line VSS need two first power supply lead-out wires 104 to be connected to an end of each external chip on film COF, and thus three adjacent third pads PAD3 are desired to be connected to two adjacent first pads PAD1 and a second pad PAD2 between the two adjacent first pads PAD1, respectively. Each chip on film COF is flexible and may be bent and extend from a front surface (i.e., a light-emitting surface) of the display apparatus to a back surface (i.e., a surface opposite to the front surface) of the display apparatus. An external driver chip may be connected to a corresponding chip on film COF and located on the back surface of the display apparatus, so as to reduce a border of the display apparatus, increase a screen ratio of the display apparatus, and thus improve the display effect of the display apparatus.

It will be appreciated that the above implementations are merely exemplary implementations for the purpose of illustrating the principle of the present disclosure, and the present disclosure is not limited thereto. Various modifications and improvements may be made by a person having ordinary skill in the art without departing from the protection scope of the disclosure defined in the accompanying claims, and accordingly, and all of such modifications and improvements fall into the protection scope of the present disclosure.

What is claimed is:

1. A display substrate, having a display region, a peripheral region surrounding the display region, and a plurality of pad regions on a first connection side of the peripheral region and distal to the display region; wherein the display region comprises a plurality of sub-pixel regions; and the display substrate further comprises: a base, and organic light-emitting diodes and a first power supply line that are on the base; wherein
   the organic light-emitting diodes are provided in the plurality of sub-pixel regions, respectively; and a cathode of each organic light-emitting diode extends from the display region to the peripheral region and is directly connected to the first power supply line in the peripheral region;
   the first connection side of the peripheral region comprises a first connection region corresponding to a position between two adjacent pad regions, and a second connection region other than the first connection region; and
   a connection region between the first power supply line and the cathode covers at least part of the second connection region.

2. The display substrate according to claim 1, wherein the second connection region comprises a first sub-connection region corresponding to each of the pad regions, and a second sub-connection region other than the first sub-connection region; and the connection region between the first power supply line and the cathode covers the first sub-connection region and the second sub-connection region.

3. The display substrate according to claim 1, wherein the display substrate further comprises a thin film transistor on the base and disposed in each sub-pixel region; and
   the first power supply line is disposed in the same layer and made of the same material as a source electrode and a drain electrode of the thin film transistor.

4. The display substrate according to claim 3, further comprising a second power supply line in the peripheral region, and a second power supply lead-out wire connected to the second power supply line; wherein
   the second power supply line is provided on a side of the first power supply line proximal to the display region; and
   the second power supply line and the second power supply lead-out wire are disposed in the same layer and made of the same material as a gate electrode of the thin film transistor.

5. The display substrate according to claim 4, wherein the first power supply line is disconnected at a position near the second power supply lead-out wire; and
   the second power supply lead-out wire is located between two adjacent portions of the disconnected first power supply line.

6. The display substrate according to claim 5, wherein one end of each of the two adjacent portions of the first power supply line is connected to a first power supply lead-out wire; and
   the first power supply lead-out wire is disposed in the same layer and made of the same material as the second power supply lead-out wire.

7. The display substrate according to claim 3, further comprising a transfer electrode configured to connect the drain electrode of the thin film transistor to an anode of the organic light-emitting diode; wherein
   the first power supply line comprises a first sub-power supply line, a second sub-power supply line, and an insulation layer between the first sub-power supply line and the second sub-power supply line; the first sub-power supply line is connected to the second sub-power supply line through a lap via penetrating through the insulation layer; and
   the first sub-power supply line is disposed in the same layer and made of the same material as both the source electrode and the drain electrode of the thin film transistor; and the second sub-power supply line is disposed in the same layer and made of the same material as the transfer electrode.

8. The display substrate according to claim 7, wherein the first sub-power supply line is disconnected at a position near the second power supply lead-out wire; and
   the second power supply lead-out wire is located between two adjacent portions of the disconnected first sub-power supply line.

9. The display substrate according to claim 3, wherein the thin film transistor comprises only a first gate electrode; and
   the second power supply line and the second power supply lead-out wire are disposed in the same layer and made of the same material as the first gate electrode of the thin film transistor.

10. The display substrate according to claim 3, wherein the thin film transistor comprises a first gate electrode and a second gate electrode disposed opposite to each other, and an insulation layer between the first gate electrode and the second gate electrode; and
    the second power supply line and the second power supply lead-out wire are disposed in the same layer and made of the same material as the first or second gate electrode of the thin film transistor.

11. The display substrate according to claim 1, wherein a portion of the cathode is directly on the first power supply line, to form a direct connection between the first power supply line and the cathode.

12. The display substrate according to claim 1, further comprising a planarization layer, a pixel defining layer, and a black matrix sequentially disposed between the first power supply line and the cathode, and a lap via penetrating through the planarization layer, the pixel defining layer, and the black matrix, wherein
the first power supply line is connected to the cathode through the lap via.

13. The display substrate according to claim 7, further comprising a passivation layer, a pixel defining layer, and a black matrix sequentially disposed between the first power supply line and the cathode, and a lap via penetrating through the passivation layer, the pixel defining layer, and the black matrix, wherein
the first power supply line is connected to the cathode through the lap via.

14. The display substrate according to claim 7, further comprising a planarization layer between the drain electrode of the thin film transistor and the anode of the organic light-emitting diode, and a first via penetrating through the planarization layer, wherein
the drain electrode of the thin film transistor is connected to the anode of the organic light-emitting diode through the first via.

15. The display substrate according to claim 14, further comprising a passivation layer between the planarization layer and the anode of the organic light-emitting diode, and a third via penetrating through the passivation layer, wherein
the third via and the first via overlap each other and are in communication with each other in a direction perpendicular to the planarization layer or the passivation layer; and
the drain electrode of the thin film transistor is connected to the anode of the organic light-emitting diode through the first via and the third via.

16. A display apparatus, comprising the display substrate according to claim 1.

17. The display apparatus according to claim 16, further comprising a plurality of first pads and a plurality of second pads disposed in the pad regions; wherein
the plurality of first pads are in one-to-one correspondence with a plurality of first power supply lead-out wires; and
the plurality of second pads are in one-to-one correspondence with a plurality of second power supply lead-out wires.

18. The display apparatus according to claim 17, further comprising a plurality of chip on films, and a plurality of third pads on each of the plurality of chip on films; wherein
one of the first pads and one of the second pads, which are adjacent to each other, are connected to two of the third pads on a same chip on film, respectively.

19. The display apparatus according to claim 17, further comprising a plurality of chip on films, and a plurality of third pads on each of the plurality of chip on films; wherein
two adjacent first pads of the plurality of first pads and one second pad, which is between the two adjacent first pads, of the plurality of second pads are connected to three third pads on a same chip on film, respectively.

20. The display substrate according to claim 2, wherein the display substrate further comprises a thin film transistor on the base and disposed in each sub-pixel region; and
the first power supply line is disposed in the same layer and made of the same material as a source electrode and a drain electrode of the thin film transistor.

* * * * *